(12) United States Patent
Tauzin et al.

(10) Patent No.: US 8,693,835 B2
(45) Date of Patent: Apr. 8, 2014

(54) METHOD FOR TRANSFERRING A THIN LAYER BY PROTON EXCHANGE

(75) Inventors: Aurélie Tauzin, Saint Egreve (FR); Jean-Sébastien Moulet, Chambery (FR)

(73) Assignees: Commissariat a l'Energie Atomique et aux Energies Alternatives, Paris (FR); S.O.I. Tec Silicon on Insulator Technologies, Bernin (FR)

( * ) Notice: Subject to any disclaimer, the term of this patent is extended or adjusted under 35 U.S.C. 154(b) by 319 days.

(21) Appl. No.: 12/937,945

(22) PCT Filed: Apr. 10, 2009

(86) PCT No.: PCT/FR2009/050647
§ 371 (c)(1),
(2), (4) Date: Oct. 14, 2010

(87) PCT Pub. No.: WO2009/136100
PCT Pub. Date: Nov. 12, 2009

(65) Prior Publication Data
US 2011/0030889 A1 Feb. 10, 2011

(30) Foreign Application Priority Data
Apr. 15, 2008 (FR) ...................................... 08 52510

(51) Int. Cl.
*G02B 6/10* (2006.01)
(52) U.S. Cl.
USPC ........... 385/131; 385/129; 385/130; 385/132; 385/37; 205/799; 359/332
(58) Field of Classification Search
USPC .............. 205/799; 359/332; 385/37, 129–132
See application file for complete search history.

(56) References Cited

U.S. PATENT DOCUMENTS

| 4,948,407 A | 8/1990 | Bindell et al. |
| 5,374,564 A | 12/1994 | Bruel |

(Continued)

FOREIGN PATENT DOCUMENTS

| WO | WO 2002/006568 | 1/2002 |
| WO | WO 2007/110515 | 10/2007 |

OTHER PUBLICATIONS

International Search Report Dated Sep. 22, 2009 (6pgs).

(Continued)

*Primary Examiner* — Harry D Wilkins, III
*Assistant Examiner* — Zulmariam Mendez
(74) *Attorney, Agent, or Firm* — Brinks Gilson & Lione

(57) ABSTRACT

A method for transferring a thin layer from a lithium-based first substrate includes proton exchange between the first substrate and a first electrolyte, which is an acid, through a free face of the first substrate so as to replace lithium ions of the first substrate by protons, in a proportion between 10% and 80%, over a first depth $e_1$. A reverse proton exchange between the first substrate and a second electrolyte, through the free face is carried out so as to replace substantially all the protons with lithium ions over a second depth $e_2$ smaller than the first depth $e_1$, and so as to leave an intermediate layer between the depths $e_1$ and $e_2$, in which intermediate layer protons incorporated during the proton exchange step remain. The depth $e_2$ defines a thin layer between the free face and the intermediate layer. A heat treatment is carried out under conditions suitable for embrittling the intermediate layer and the thin film is separated from the first substrate at the intermediate layer.

18 Claims, 1 Drawing Sheet

(56) References Cited

U.S. PATENT DOCUMENTS

| | | | |
|---|---|---|---|
| 6,020,252 | A | 2/2000 | Aspar et al. |
| 6,185,355 | B1 | 2/2001 | Hung |
| 2002/0035856 | A1 | 3/2002 | Hung |

OTHER PUBLICATIONS

Ahlfeldt H. et al., "*Structural and Optical Properties of Annealed Proton-Exchanged Waveguides in z-cut LiTaO$_3$*"—*J. Appl. Phys.* 77 (9), (May 1, 1995), pp. 4467-4476.

Domenech, M. et al., "*Fabrication and Characterisation of Reverse Proton Exchange Optical Waveguides in Neodymium Doped Lithium Niobate Crystals*"—Material Science Forum vols. 480-481 (2005) pp. 429-436.

Korkishko N. Yu, et al., "*Reverse Proton Exchange for Buried Waveguides in LiNbO$_3$*"—1998 Optical Society of America A/vol. 15 No. 7—(Jul. 1998) pp. 1838-1842.

Marangoni, M. et al., "*High Quality Waveguides by Reverse-Proton-Exchange in Stoichiometric Lithium Tantalate*"—Proceedings of the SPIE-The International Society for Optical Engineering SPIE-INT, Soc. Opt. Eng USA, vol. 5451, No. 1, (2004), pp. 74-81.

Moulet et al., "*High Piezoelectric Properties in LiNbO$_3$ Transferred Layer by the Smart Cut™ Technology for Ultra Wide Band BAW Filter Applications*"—IEDM 2008. IEEE International Electron Devices Meeting. Technical Digest IEEE, 2008, 4 pages.

Tauzin, A. et al., "*3-Inch Single-Crystal LiTaO$_3$ Films onto Metalic Electrode Using Smart Cut™ Technology*"—European Patent Office, Download on (Sep. 22, 2009) from *IEEE Xplore—Electronic Letters* Jun. 19, 2008, vol. 44—No. 13.

METHOD FOR TRANSFERRING A THIN LAYER BY PROTON EXCHANGE

PRIORITY CLAIM

This application is a nationalization under 35 U.S.C. 371 of PCT Application No. PCT/FR2009/050647, filed Apr. 10, 2009, which claims priority to French Patent Application No. 0852510, filed Apr. 15, 2008, incorporated by reference herein.

TECHNICAL FIELD

In the field of microelectronic components in particular including micro-mechanical, micro-acoustic, micro-optical components, the invention relates to the transfer of a thin layer by proton exchange, from a starting substrate to another substrate, which can be either an intermediate substrate or a final substrate.

BACKGROUND

Among the known methods for providing transfer of a thin layer, the method known by the name of "Smart Cut™" has become particularly significant. This method uses ion implantation in a substrate, by bombarding one of the faces of said substrate using, typically, a flux of hydrogen, helium and/or rare gas ions. This ion bombardment results in a concentration of these ions in a zone located at a given depth within the substrate under the bombardment surface; a second substrate is typically joined to the first substrate along the bombardment surface (this second substrate can have been formed previously and is bonded to the first substrate, typically by molecular bonding; as a variant, it can be formed directly on said bombardment surface, for example by deposition), then thermal and/or mechanical-chemical conditions are applied to the assembly which, taking into account the implantation conditions and subsequent treatments, cause separation of the thin layer (situated between the bombardment surface and the concentration zone) with respect to the rest of the first substrate; the method can then be repeated, taking as starting substrate, the rest of the aforementioned substrate, after separation of the thin layer (a plurality of thin layers can thus be formed in the thickness of the same substrate). This method is in particular described in U.S. Pat. No. 5,374,564 (Bruel) and—U.S. Pat. No. 6,020,252 (Asper et al.).

Several variants have subsequently been proposed, consisting for example of implanting, by bombardment, ions which by themselves do not form gas molecules, but which can promote the formation of gas molecules from elements of the first substrate. For example as disclosed by PCT published application No. WO2007/110515 to Tauzin.

Moreover, use of other techniques for introducing ions, such as plasma immersion or high-temperature diffusion, has been envisaged.

A thin layer thus transferred serves in practice as a support for microcomponents (microelectronic, micro-mechanical, micro-acoustic, micro-optical and the like), optionally formed wholly or partly before separation of said thin layer, so that it is important that the thin layer obtained by such a transfer has optimum microcrystalline, electrical, mechanical, properties and the like; it is moreover important that the operations of implantation, of bonding and of separation are compatible with the stages of formation of the components intended to be carried by this thin layer, when certain of these stages of formation are carried out prior to separation. In particular, it is generally considered desirable not to exceed certain temperature thresholds, for example of the order of 400° C., or even lower, and to manage to introduce the ions into the concentration layer without excessively degrading the thin layer that is to be transferred. In practice, bonding of the future thin layer to the substrate to which it is to be transferred involves thermal treatments, either for consolidating molecular bonding with this destination substrate, or for depositing a thick film that is to form said destination substrate; moreover, ion implantation by bombardment, which may seem preferable to techniques of plasma immersion or high-temperature diffusion, causes perturbations in the microcrystalline lattice of the thin layer, which may, under certain conditions, degrade the mechanical or electrical properties of the thin layer.

In practice, layer transfer by ion implantation is limited to layer thicknesses equivalent to the depth attainable by the implanting equipment. Unless implanters that are very powerful and therefore very expensive are used, this maximum thickness is of the order of a micrometer.

This explains why it is advantageous for a person skilled in the art to have several transfer techniques at his disposal, so as to have a choice for a particular case.

DETAILED DESCRIPTION

The invention thus aims to propose a new technique for thin layer transfer, suitable for at least some of the materials used in microelectronic and similar applications and for thicknesses that can exceed the order of a micrometer (several micrometers, for example), which combines, in application times and levels of reproducibility compatible with industrial production rates, moderate working temperatures and controlled degradation, as low as possible, of the mechanical and electronic properties of the thin layer, all at reasonable cost.

The invention proposes a method for transferring a thin layer from a starting substrate of a lithium-based material, comprising:

a stage of proton exchange between said substrate and a first electrolyte which is acid, through a free face of said substrate, so as to replace lithium ions with protons, in a proportion between 10% and 80%, to a depth $e1$, a stage of reverse proton exchange between said substrate and a second electrolyte, through said free face, so as to replace, to a second depth $e2$ which is less than the first depth $e1$, at least almost all of the protons with lithium ions, so as to leave an intermediate layer between the depth $e1$ and the depth $e2$ in which there are still protons that were incorporated during the stage of proton exchange, the depth $e2$ defining a thin layer between said free face and the intermediate layer, a stage of thermal treatment carried out under conditions suitable for causing weakening of the intermediate layer, and a separation stage, for bringing about the separation of the thin layer with respect to the rest of the substrate at the level of the intermediate layer.

Proton exchange is well known per se, in the specific field of the production of waveguides. Thus,—U.S. Pat. No. 4,948, 407 proposed in 1990 the application of proton exchange for making waveguides in $LiNbO_3$; proton exchange is achieved by immersion in sulphuric acid and it is stated that an annealing treatment is necessary to enable the protons to reach a sufficient depth to ensure effective wave-guiding.

The article "Structural and optical properties of annealed proton-exchanged waveguides in Z-cut $LiTaO_3$," by Ahlfeldt, Webjörn, Thomas and Teat, in Journal of Applied Physics (ISSN 0021-8979), Vol. 77 No. 9, pp. 4467-4476 of May 1995, proposes characterization of the optical characteristics of waveguides in LiTaO$_3$ obtained by proton exchange, and a model for predicting the refractive index in ferroelectric materials is used for explaining the difference in the increase in refractive index in LiNbO$_3$ and in LiTaO$_3$.

More recently,—U.S. Publication No. 2002/035856 proposed in 2002 (see also—U.S. Pat. No. 6,185,355) making integrated optical devices by means of proton exchange with annealing over several cycles. By way of example, a substrate of lithium niobate (LiNbO$_3$, commonly abbreviated to LNO) or of lithium tantalate (LiTaO$_3$, commonly abbreviated to LTO) is placed in an electrolyte, for example based on benzoic acid at 200-240° C. for 1 to 30 hours, then annealed in air, for example at 300° C. for 1 h. The hydrogen contained in the electrolyte then diffuses into the LTO or LNO and replaces the Li ion of the crystal, forming, from the surface, a surface layer of thickness e1 (of the order of 1 to 10 μm), constituted, depending on the lithium compound, by a new phase H$_x$Li1-xTaO$_3$ or H$_x$Li1-xNbO$_3$ with 0<x<80%. The combination of proton exchange, optionally followed by annealing, and of reverse proton exchange has also been proposed in the field of waveguides, in particular in the article "Reverse proton exchange for buried waveguides in LiNbO$_3$" by Korkishko, Fedorov, Morozova, Caccavale, Gonella and Segato in Journal of the Optical Society of America A. 15, pp. 1838-1842 (1998), with respect to LiNbO$_3$, or "Fabrication and Characterization of Reverse Proton Exchange Optical Waveguides in Neodymium Doped Lithium Niobate Crystals" by Domenech, Lifante, Cusso, Parisi, Cino, Riva Sanseverino, in Materials Science Forum, Vol. 480-481, pp. 429-436, in 2005. By way of example, this reverse proton exchange treatment is obtained by immersing the substrate in a solution rich in lithium (for example: NaNO$_3$, KNO$_3$ and LiNO$_3$ at concentration 10:10:1) heated at 330° C. for some hours. This stage permits diffusion of Li ions into the substrate H$_x$Li1-xTaO$_3$ or H$_x$Li1-xNbO$_3$ and substitution of Li ions for H ions from the surface, in order to reform a thin surface layer of LiTaO$_3$ or LiNbO$_3$ of thickness e2<e1 (e2 is of the order of a micrometer). The H$_x$Li1-xTaO$_3$ layer is then buried, located between e1 and e2.

The proton exchange treatment is often called PE (for "Proton Exchange") or APE (for "Annealed Proton Exchange"), and the reverse proton exchange treatment is often called RPE (for "Reversed Proton Exchange").

It should be noted that the stage of proton exchange can comprise, inherently, a thermal annealing treatment when, for example, the chemical treatment that produces proton exchange (contacting of the substrate with the electrolyte) is carried out with heating; as a variant, there may be, before the stage of reverse proton exchange, a further stage of annealing treatment, possibly supplementing the chemical treatment proper.

Thus, it had already been found that treatments of proton exchange can take advantage of the excellent optical properties that lithium niobate or lithium tantalate can have.

However, it had not been understood that this technique of proton exchange (direct or reverse) could also be utilized in the field of transfer of thin layers, in particular with substrates constituted by the aforementioned materials.

It had been found that the application of proton exchange causes degradation of the zone in which said exchange occurs, but it had also been found that a subsequent moderate thermal treatment enabled this degradation to be minimized (see the aforementioned—U.S. Publication No. 2002/035856), and said treatment was consequently regarded as necessary.

In fact, a person skilled in the art, on finding that a stage of proton exchange caused degradation of the zone involved in this exchange, could not imagine that this effect could be utilized in a transfer technique. In fact, if he assumed that the thermal treatment for repair was effective, he would have to conclude that that there would not be any residual weakening in the zone affected and that, conversely, the application of an additional treatment (reverse proton exchange) would not enable recovery of a crystal quality that is sufficient for the applications envisaged; conversely, if he assumed that the repair was very imperfect, he could only conclude that the application of a supplementary treatment of reverse proton exchange could not repair the degradation of the material in the zone affected both by the treatment of direct proton exchange and by the treatment of reverse proton exchange.

In fact, it is completely surprising that it was found that for lithium compounds, such as niobate or tantalate, the application of reverse proton exchange treatment makes it possible to reform the starting crystal (LTO or LNO for example) with good crystallographic quality. Moreover, application of the stage of proton exchange and of the stage of reverse proton exchange at different depths (the stage of reverse proton exchange being performed at a smaller depth than the stage of proton exchange) leaves a zone in the substrate that can undergo substantial weakening, between the zone unaffected by either of the treatments of proton exchange and the zone affected by each of the two treatments of proton exchange in question.

Thus, it was found that the zone doubly affected by the proton exchanges has a satisfactory microcrystalline and microelectronic quality, at least equal to that obtained by the technique of solid state synthesis, yet is separated from the rest of the substrate by a zone that is sufficiently weakened to permit separation under similar conditions applied for the separation of a thin layer under the conventional conditions of weakening by ion bombardment.

The invention follows even less from the teaching of the aforementioned documents since, in these documents, the intermediate zone between the two zones (namely the zone not affected by either of the two treatments of proton exchange, and that affected successively by each of these treatments) is a zone of quite particular interest, whereas the invention teaches destruction thereof, during the stage of separation.

It should be emphasized that the thermal weakening treatment only has a true effect of weakening of the intermediate zone because the hydrogen that was introduced into it during proton exchange remained confined there after reverse proton exchange. In the absence of said reverse proton exchange, the hydrogen would participate in phenomena such as hydrogen diffusion, substitution of lithium by hydrogen, and the like, which would lead to distribution of the hydrogen and hence minimization of the consequences of its presence. However, it was found that, owing to said confinement, the thermal treatment following reverse proton exchange leads the hydrogen ions to regroup to form gas molecules and then cavities, and hence sufficient weakening to permit separation by techniques similar to those usable with the "Smart Cut™" technology.

This explains why the thermal treatment that follows the stage of reverse proton exchange has a weakening effect, in contrast to the treatments recommended in—U.S. Publication No. 2002/035856 (or—U.S. Pat. No. 6,185,355), which have healing effects.

The invention relates to the transfer of thin layers from a substrate constituted, at least near its free surface, by lithium compounds, in particular its oxides or its salts, such as a niobate or a tantalate, for which the techniques of proton exchange, direct or reverse, have already been thoroughly investigated (it can be a solid substrate constituted by said lithium-based material, or by a substrate of which only a surface layer is made of said material since the depths of the stages of proton exchange are less than the thickness of said surface layer). Other lithium-based materials can be mentioned such as:

$LiD_3(SeO_3)_2$: lithium trihydrogen selenite
$LiTlC_4H_4O_6\text{-}4H_2O$: lithium thallium tartrate
$Li(N_2H_5)SO_4$: lithium hydrazinium sulphate Preferably, the substrate is monocrystalline, with an orientation preferably perpendicular to the free surface of the substrate (which corresponds to the crystallographic notation (001)).

According to preferred characteristics of the an embodiment of the invention, optionally combined:

the intermediate layer has a thickness of at least one micrometer; advantageously, the depth e1 is at least equal to 5 micrometers and the second depth e2 is at least equal to 3 micrometers, the intermediate layer having a thickness of at least 2 micrometers; this gives considerable latitude for selecting the thicknesses of the intermediate layer and the thin layer, the starting substrate is monocrystalline, which promotes the penetration of the protons, provided the orientation of the microstructure is properly selected, the first electrolyte is an acid bath comprising benzoic acid or a hydrosulphate, in which the substrate is immersed for a time from 1 h to 30 h at a temperature between 220° C. and 350° C.; such a treatment has already proved suitable, in particular in the case of lithium oxides, the second electrolyte is a bath containing a mixture of salts of lithium, sodium and potassium in which the substrate is immersed for a time from 0.5 h to 5 h at a temperature between 300° C. and 350° C.; such a treatment has also already been well tested in the case of lithium compounds, the optional stage of annealing, before the stage of reverse proton exchange, is carried out at a temperature between 300° C. and 380° C. for a time between 0.5 h and 30 h; this offers considerable choice, depending on whether one wishes to avoid a temperature rise, or to proceed rapidly, a bonding stage is provided in the course of which said substrate is bonded by said thin layer to a second substrate (nevertheless, it is to be understood that such a stage is not necessary when the thin layer has a sufficient thickness—typically several micrometers—to be able to be manipulated without a carrier substrate); advantageously, this stage of bonding to a second substrate comprises molecular bonding between the starting substrate and this second substrate, which is a bonding technique that has already been well researched for a great variety of materials in the field of microelectronics; advantageously, said molecular bonding is preceded by a stage of deposition of at least one keying layer on one or other of the substrates, the stage of thermal weakening treatment (for example carried out during or after the optional bonding stage) is carried out for a time between 1 minute and 100 hours (typically between 0.5 h and 2 h) between temperatures of 100° C. and 500° C. (typically between 200° C. and 350° C.), which proves to be reasonably quick, without involving a in particular high temperature; according to a first case, separation is then obtained by a thermal treatment continuing the thermal weakening treatment; preferably, the thermal weakening treatment and the stage of separation are obtained by a progressive temperature rise, at a rate between 0.1° C./min and 5° C./min (preferably between 1° C./min and 5° C./min), until the desired separation is achieved; as a variant, the stage of separation is obtained by the insertion of a blade at the level of the weakened intermediate layer, very generally, separation is obtained by application of a thermal treatment and/or of a mechanical stress of detachment, by pulling and/or bending and/or shearing and/or by the insertion of a blade, and/or by the application of ultrasound or microwaves, which means using techniques that have already been mastered in conventional transfer techniques.

BRIEF DESCRIPTION OF DRAWING

Objects, characteristics and advantages of the invention will become apparent from the following description, given as an illustrative, non-limitative example, referring to the attached drawings, in which:

FIGS. 1 to 4 represent an example of a method for transferring a thin layer from a starting substrate 10 made of a lithium-based material.

DETAILED DESCRIPTION

Figure 1:
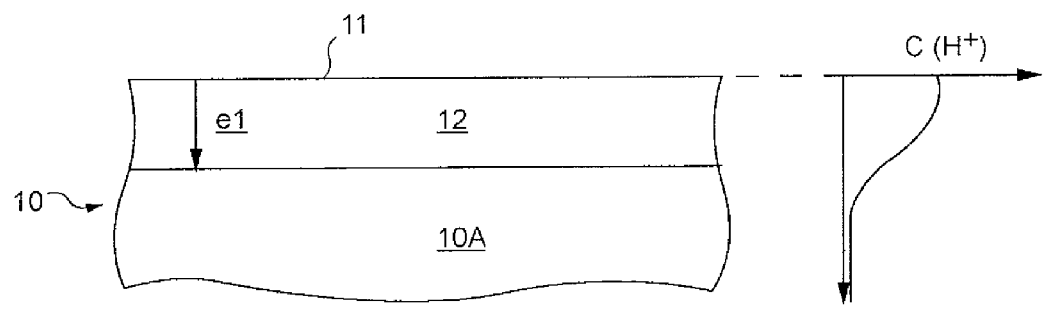
FIG. 1 is a diagrammatic sectional view of a starting substrate, which has undergone a treatment of proton exchange, followed by annealing, with, on the right, a graph showing diagrammatically the concentration of protons.
Figure 2:
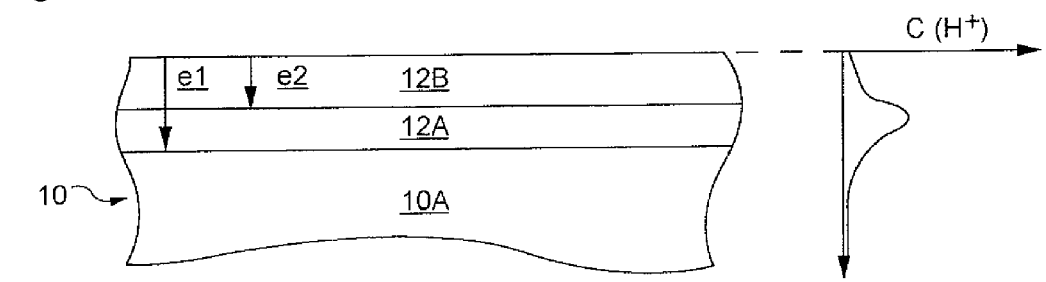
FIG. 2 is a diagrammatic sectional view of this substrate after the application of a reverse proton exchange treatment, with, on the right, a graph showing schematically the concentration of protons.
Figure 3:
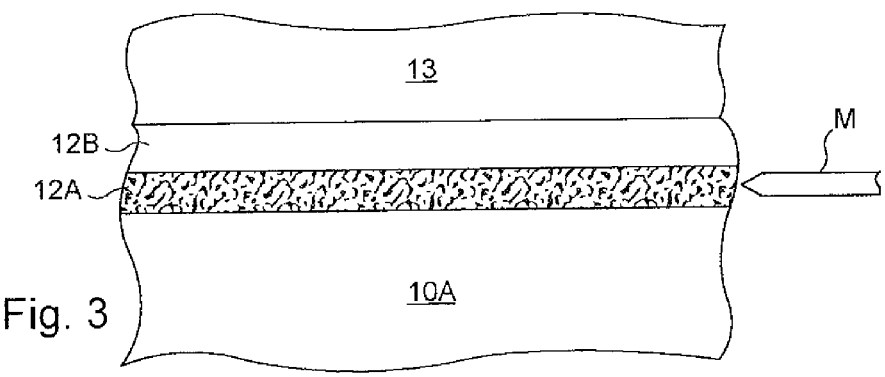
FIG. 3 is a diagrammatic sectional view of this substrate in the course of a thermal weakening treatment.
Figure 4:
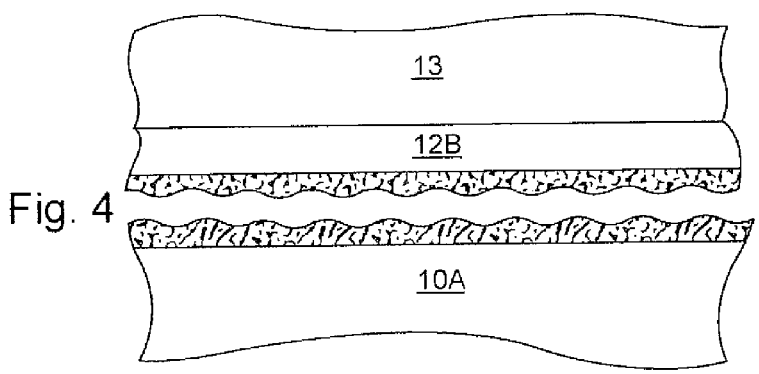
FIG. 4 is a diagrammatic sectional view of this substrate after separation of the thin layer, before final polishing.

This method comprises the following main stages:

a stage of proton exchange between said substrate 10 and a first electrolyte (not shown) which is acid, through a free face 11 of said substrate so as to replace the lithium ions present in the substrate with protons, in a proportion between 10% and 80%, to a depth e1; the profile of protons $H^+$, or of hydrogen ions, has a plateau starting from the free face 11 and then a steady decrease to the minimum, within the rest of the substrate 10—see FIG. 1, an optional stage of annealing to promote rearrangement of the ions so that protons that have diffused to the thickness e1 recombine with the components of the material of the substrate, to the detriment of the initial element (lithium); therefore a surface layer 12 is obtained, along the free face 11, the microstructure of which, initially identical to that of the rest of the substrate 10 (labelled 10A), has been modified (the concentration profile is not altered appreciably by this stage), a stage of reverse proton exchange between said substrate and a second electrolyte (not shown), through this free face 11, so as to replace, to a second depth e2 less than the first depth e1, at least almost all of the protons with ions of said element (lithium), so as to leave an intermediate layer 12A, between the depths e2 and e1, for example of at least 1 micrometer, in which there is still a high proportion of the protons incorporated in the material during the stage of proton exchange, the depth e2 defining a thin layer 12B between said free face 11 and the intermediate layer 12A—see FIG. 2, with on the right a bell-shaped profile of the concentration of $H^+$ ions, an optional bonding stage, during which said substrate is joined by said thin layer to a second substrate 13 (keying layers, not shown (in practice much thinner than the thicknesses e1 and e2) can be formed beforehand on the faces in question), a stage of thermal treatment, carried out during or after the bonding stage (when it takes place), under conditions suitable for causing weakening of the intermediate layer 12A; and a stage of separation in order to cause, based on the configuration in FIG. 3, separation of the thin layer (joined to the substrate 13, if the optional bonding stage has taken place) with respect to the rest of the substrate—see FIG. 4; in fact separation can be obtained by thermal treatment (for example by carrying out the weakening treatment in FIG. 3) and/or by the application of mechanical stresses (pulling, bending, etc.), for example by means of the blade M in FIG. 3 (as a variant, it can in particular be a fluid jet, for example pneumatic, etc.).

The conditions of proton exchange can correspond in themselves to an annealing treatment; in fact, the chemical part of this proton exchange (contacting the substrate with the electrolyte, therefore elements that participate in the exchange) can be carried out with heating; however, there can be a supplementary annealing; according to another variant, the chemical stage can be carried out at a low temperature, followed by annealing. In other words, there is advantageously an annealing treatment during, or after, contacting the substrate with the electrolyte, but before the stage of reverse proton exchange.

In practice, the separation, which takes place within the weakened layer, leaves behind on the thin layer 12B, as well as on the remainder 10A of the substrate, a proportion of this weakened layer, which is rough; mechanical or chemical mechanical polishing advantageously makes it possible to remove these parts so that the thin layer 13 is clean and the rest of the substrate 10A can be used for a new cycle as described hereunder.

Of course, stages of any appropriate known type, participating in the formation, on the free face or in the thin layer, of all or part of electronic and/or mechanical and/or optical, etc. microcomponents, as required, can be interposed between these stages.

The invention relates to lithium compounds, more particularly to lithium oxides. The rest of the description will examine the cases of lithium niobate and lithium tantalate. The invention also relates to other compounds based on lithium such as $LiD_3(SeO_3)_2$ (lithium trihydrogen selenite), $LiTlC_4H_4O_6\cdot4H_2O$ (lithium thallium tartrate), $Li(N_2H_5)SO_4$ (lithium hydrazinium sulphate) etc.

As shown in the preamble, the application of a proton exchange treatment, including in combination with a subsequent treatment of reverse proton exchange has already been mentioned, in the case of lithium niobate or tantalate, essentially for making optical components, in particular waveguides having optoelectronic properties.

In the case of lithium tantalate or niobate, an embodiment of the invention can be defined by the following successive stages:

1. formation of an $HxLi1-xTaO3$ or $HxLi1-xNbO3$ layer with $10\%<x<80\%$ from the surface to a depth e1, by proton exchange and annealing,
2. formation of an LiTaO3 or LiNbO3 layer from the surface to a depth $e2<e1$, by reverse proton exchange,
3. intimate contact of the material with a stiffener (such as a second substrate),
4. fracture at the level of the $HxLi1-xTaO3$ or $HxLi1-xNbO3$ layer buried between e1 and e2, by the application of a thermal treatment and/or of a detaching force (for example, insertion of a blade between the two substrates and/or pulling and/or bending and/or shearing stresses, and/or the application of ultrasound or of microwaves of carefully selected power and frequency),
5. removal of the $HxLi1-xTaO3$ or $HxLi1-xNbO3$ layer Examples of application of the invention are described below, in the case of lithium tantalate, and then lithium niobate.

Example 1

A substrate of monocrystalline LiTaO3 with (001) orientation (surfaces normal to the polar axis) is placed in an electrolyte constituted by benzoic acid, lithium benzoate and ammonium dihydrogen phosphate at 330° C. for some hours, then annealed at 370° C. for 30 min in order to obtain the $HxLi1-xTaO3$ phase over a thickness >5 µm from the surface of the LTO. The reaction of reverse proton exchange is then carried out using a bath at 330° C. of KNO3/NaNO3/LiNO3 in the molar proportions 1/1/0.1 respectively, for several hours. A buried layer of $HxLi1-xTaO3$ is then obtained located about 2 to 6 µm under the surface of the LiTaO3. The concentration of H is of the order of 10 atomic-%.

The substrate is then covered on its front face with a layer of chromium of thickness 100 nm, deposited by evaporation. A second LiTaO3 substrate intended to serve as a second substrate or stiffener is covered on its front face with a layer of $SiO_2$ of thickness 400 nm, deposited by IBS (Ion Beam Sputtering). The two front faces of the LiTaO3 plates undergo conventional stages of molecular bonding: cleaning known by the name "Caro" (solution: 97% $H_2SO_4$ and 30% $H_2O_2$ in a proportion of 2/1 or 3/1) followed by rinsing with DIW (for "Deionized Water"), chemical mechanical polishing (using conventional colloidal silica as abrasive), brushing of the plates in DIW, drying by centrifugation, and intimate contact.

It is to be noted that intimate contact means that the plates are approached by a local contact point, and a bonding wave is then propagated over the whole of the surfaces to be bonded.

The two surfaces are then bonded by molecular adhesion. The two bonded substrates are then subjected to a thermal weakening treatment, so as to form microcavities or microcracks extending at the level of the $HxLi1-xTaO3$ zone of the substrate that has only undergone the APE stage. The thermal treatment consists of a temperature ramp/gradient of 2° C./min from ambient temperature up to ~300° C., the temperature at which transfer of a thin layer of LiTaO3 takes place by fracture at the level of the $HxLi1-xTaO3$ zone. The structure obtained after transfer is as follows: $HxLi1-xTaO3$ 2 µm/LiTaO3 2 µm/Cr 100 nm/$SiO_2$ 400 nm/LiTaO3 substrate.

The $HxLi1-xTaO3$ surface layer is then removed by chemical mechanical polishing (CMP); the LiTaO3 layer transferred is reduced in thickness to 15-20 nm by CMP. The structure obtained is in particular interesting for devices such as ferroelectric memories (FRAM: ferric random-access memory).

The rest of the substrate can then undergo a new cycle of formation of a thin layer, and so on.

Example 2

A substrate of monocrystalline LiNbO3 with (001) orientation (surfaces normal to the polar axis) is placed in an electrolyte constituted by glycerinated KHSO4 at 230° C. for 18 h, then annealed at 325° C. for 30 h. The RPE stage is carried out in a eutectic bath of LiNO3 (37.5 mol. %)-KNO3 (44.5 mol. %)-NaNO3 (18.0 mol. %) at a temperature of 320° C. for 4 h.

The buried layer rich in H is located about 2 to 5 μm under the surface of the LiTaO3. The concentration of H is of the order of 10 atomic-%.

The substrate is then covered on its front face with a layer of platinum, of thickness 100 nm, deposited by evaporation. An Si substrate is covered with a layer of thermal $SiO_2$ of thickness 400 nm. The two plates are bonded by molecular adhesion and are then subjected to a thermal treatment of 250° C.-1 h, so as to form microcavities or microcracks extending at the level of the HxLi1-xNbO3 zone of the substrate that has only undergone the APE stage. Fracture at the level of the zone with the microcavities is then caused by the insertion of a blade at the bonding interface. The structure obtained after transfer is as follows: HxLi1-xNbO3 1 μm/LiTaO3 2 μm/Pt 100 nm/$SiO_2$ 400 nm/Si substrate. The HxLi1-xNbO3 surface layer is then removed by chemical mechanical polishing. The structure obtained is in particular useful for devices such as surface acoustic wave (SAW) resonators.

The operating conditions for carrying out the stages of direct proton exchange, and/or reverse proton exchange, can be the same as the operating conditions proposed in the state of the art for the fabrication of waveguides. However, it may be useful to adapt these conditions depending on the application envisaged, in particular to:

control the thickness e2 of the thin film that is to be transferred form an intermediate layer of required thickness: the finer this thickness for example, the lower the roughness after separation, control the concentration of protons introduced to obtain a variable ease of separation: for example, if the concentration is higher, separation can be obtained with a lower thermal budget.

It will be appreciated that, relative to a transfer technique based on the "Smart Cut™" method, the invention has substantial differences, including in particular the following:

the combination of direct proton exchange and reverse proton exchange involves two changes of microstructure and composition, in contrast to ion implantation by bombardment where the microcrystalline perturbations are concentrated in the future weakening layer, where Si—H complexes or H2 precipitates or platelets etc. are formed, without significantly modifying the microstructure and composition of the starting substrate, in particular with respect to the future thin layer, depending on the conditions of the two treatments of direct and then reverse proton exchange, the thickness of the weakening layer can easily be controlled, and can be greater than with implantation by bombardment, it is true that the two successive modifications of composition and microstructure within the future thin layer may make molecular bonding more difficult than with implantation by bombardment, but it appeared that the knowledge of a person skilled in the art regarding molecular bonding would nevertheless enable him to obtain molecular bonding of good quality.

The invention claimed is:

1. A method for transferring a thin layer from a first substrate including lithium ions, the method comprising:

proton exchange between the first substrate and a first electrolyte comprising an acid, through a free face of the first substrate so as to replace the lithium ions of the substrate with protons, in a proportion between 10% and 80%, to a first depth;

reverse proton exchange between the first substrate and a second electrolyte, through the free face, so as to replace substantially all of the protons with lithium ions to a second depth less than the first depth, and so as to leave an intermediate layer between the first and second depths including the protons incorporated during the proton exchange, wherein the second depth defines a thin layer between the free face and the intermediate layer;

after reverse proton exchange, carrying out a thermal treatment under conditions suitable for weakening the intermediate layer, and separating the thin layer with respect to the rest of the substrate at the level of the intermediate layer.

2. The method according to claim 1, wherein the intermediate layer has a thickness of at least one micrometer.

3. The method according to claim 2, wherein the first depth is at least equal to 5 micrometers and the second depth is at least equal to 3 micrometers, and wherein the intermediate layer has a thickness of at least 2 micrometers.

4. The method according to claim 1, wherein the first substrate comprises a monocrystalline substrate.

5. The method according to claim 1, wherein the first substrate comprises lithium tantalate or of lithium niobate at least near the free face.

6. The method according to claim 5, wherein the first electrolyte comprises an acid bath comprising benzoic acid or a hydrosulphate, in which the first substrate is immersed for a time from 1 hours to 30 hours at a temperature between 220° C. and 350° C.

7. The method according to claim 5 or claim 6, wherein the second electrolyte comprises a bath comprising a mixture of salts of lithium, sodium and potassium in which the substrate is immersed for a time from 0.5 hours to 5 hours at a temperature between 300° C. and 350° C.

8. The method according to claim 1, wherein a annealing process is carried out before the reverse proton exchange at a temperature between 300° C. and 380° C. for a time between 0.5 hours and 30 hours.

9. The method according to claim 1 further comprising bonding the thin layer of the first substrate to a second substrate.

10. The method according to claim 9, wherein bonding the thin layer to a second substrate comprises molecular bonding between the first substrate and the second substrate.

11. The method according to claim 10 further comprising depositing at least one keying layer on the first or second substrate prior to the molecular bonding.

12. The method according to claim 1, wherein the thermal treatment is carried out for a time between 1 minute and 100 hours, and between temperatures from 100° C. at 500° C.

13. The method according to claim 12, wherein separating the thin layer occurs during the thermal treatment or by a subsequent thermal treatment that continues weakening the intermediate layer.

14. The method according to claim 13, wherein the thermal treatment and separating the thin film comprise a progressive temperature rise at a rate between 0.1° C./min and 5° C./min.

15. The method according to claim 12, wherein separating the thin film comprises inserting a blade at the level of the weakened intermediate layer.

16. The method according to claim 1, wherein separating the thin film comprises application of a detaching mechanical stress by one of or a combination of two or more of pulling, bending, shearing, inserting a blade, or applying an ultrasound or microwaves.

17. The method according to claim 12, wherein the thermal treatment is carried out between 200° C. and 350° C.

18. The method according to claim 14, wherein the progressive temperature rise is performed at a rate of 1° C./min and 5° C./min.

\* \* \* \* \*